United States Patent [19]

Kawakami et al.

[11] Patent Number: 5,262,596
[45] Date of Patent: Nov. 16, 1993

[54] PRINTED WIRING BOARD SHIELDED FROM ELECTROMAGNETIC WAVE

[75] Inventors: Shin Kawakami; Hirotaka Okonogi; Katsutomo Nikaido; Junichi Ichikawa; Yoshio Nishiyama, all of Saitama, Japan

[73] Assignee: Nippon CMK Corp., Japan

[21] Appl. No.: 776,633

[22] Filed: Oct. 15, 1991

[30] Foreign Application Priority Data

Oct. 15, 1990 [JP] Japan .................. 2-107867[U]

[51] Int. Cl.⁵ .................................... H05K 1/00
[52] U.S. Cl. ........................... 174/261; 174/35 R
[58] Field of Search ............. 174/250, 254, 255, 257, 174/261, 35 R; 361/410; 428/901

[56] References Cited

U.S. PATENT DOCUMENTS

| | | | |
|---|---|---|---|
| 3,647,585 | 3/1972 | Fritzinger et al. | 174/261 X |
| 4,118,595 | 10/1978 | Pfahnl et al. | 174/261 |
| 4,141,055 | 2/1979 | Berry et al. | 174/261 X |
| 4,801,489 | 1/1989 | Nakagawa et al. | 174/35 R X |

Primary Examiner—Leo P. Picard
Assistant Examiner—Trinidad Korka
Attorney, Agent, or Firm—Bruce L. Adams; Van C. Wilks

[57] ABSTRACT

A printed wiring board shielded from electromagnetic wave radiation has a conductive circuit pattern formed on an insulating substrate, a first insulating layer disposed over the circuit pattern, a jumper wire formed over the first insulating layer and between connecting terminals of the conductive pattern, a second insulating layer covering the jumper wire and the first insulating layer, and an electromagnetic wave shielding layer disposed over the conductive pattern. The jumper wire is formed by printing using a conductive paste containing a conductive material such as silver, carbon or copper. The shield layer is formed by printing using a conductive metal resin paste such as copper. An overcoat layer is applied over the shield layer to protect the shield layer.

10 Claims, 1 Drawing Sheet

PRINTED WIRING BOARD SHIELDED FROM ELECTROMAGNETIC WAVE

BACKGROUND OF THE INVENTION

Field of the Invention

The present invention relates to a printed-wiring board shielded from electromagnetic waves in which required portions of the conductive pattern are coated with an electromagnetic wave shield layer.

The conventional printed-wiring board is constructed by forming a conductive pattern on one or both sides of an insulating substrate, and thereafter coating the conductive pattern with an insulating layer except for the electrical connecting portions of the conductive pattern. In addition, it is known in the conventional art to construct a printed-wiring board as illustrated in FIG. 2 in which the conductive pattern 2 formed in the insulating substrate 1 is covered with an insulating layer 3, and a jumper wire 4 composed of a conductive paste containing a conductive metal such as silver, carbon or copper is formed between the connecting terminals 2a and 2b of the conductive pattern 2.

However, such a conventional printed-wiring board is defective in that the conductive pattern has an extremely high density and is therefore susceptible to the adverse effect of electromagnetic wave noise.

SUMMARY OF THE INVENTION

Accordingly, the present invention was developed to cure the defect in the prior art, and has an object of providing a printed-wiring board which is not adversely affected by electromagnetic wave noise and which can prevent electromagnetic wave noise from emanating from the jumper wire.

The printed-wiring board shielded from electromagnetic waves. waves according to the present invention comprises a conductive pattern formed on an insulating substrate, a jumper wire formed between the required connecting terminals of the conductive pattern through a first insulating layer, a second insulating layer covering the jumper wire, and an electromagnetic wave shield layer for shielding the conductive pattern including the jumper wire.

DETAILED DESCRIPTION OF THE PREFERRED EMBODIMENT

Figure 1:
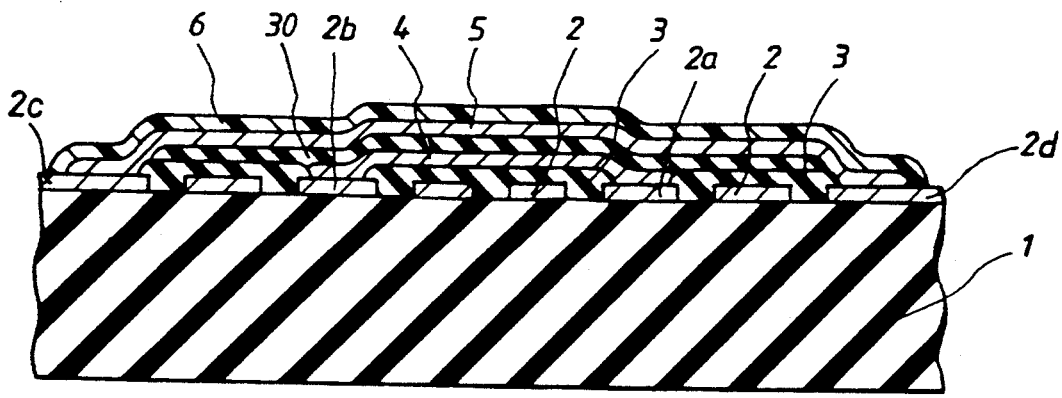
FIG. 1 is a sectional view showing an embodiment of the printed-wiring board shielded from electromagnetic waves according to the present invention.
Figure 2:
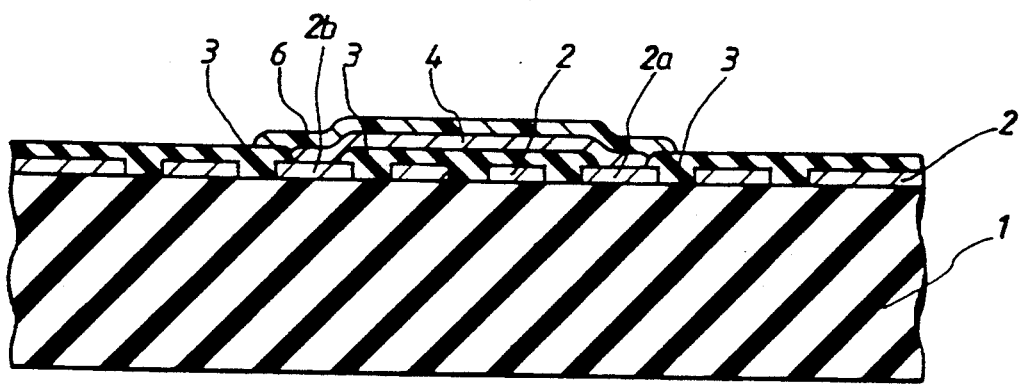
FIG. 2 is a sectional view of the conventional printed-wiring board.

The preferred embodiment of the printed-wiring board according to present invention is now described in conjunction with the accompanying drawing.

First, a conductive pattern 2 is formed on an insulating substrate 1 by the usual method.

That is, the conductive pattern 2 is formed by applying an etching work to a single-sided copper-clad laminate.

Thereafter, an insulating layer 3 is formed over the conductive pattern 2, except for the electrical connecting portions of the conductive pattern 2, that is, the connecting terminals 2a and 2b of a jumper wire 4 and the ground terminals 2c and 2d of a shield layer 5.

The insulating layer 3 can be formed by depositing an insulating paste by the use of silk printing, and thereafter hardening it.

After the formation of the insulating layer 3, the jumper wire 4 is deposited between the connecting terminals 2a and 2b. The jumper wire 4 is then covered with an insulating layer 30. Required portions of the conductive pattern 2 or the whole surface thereof is then shielded by depositing the shield layer 5, thereby forming a printed-wiring board 10 shielded from electromagnetic wave.

The jumper wire 4, the insulating layer 30 covering the jumper wire 4, and the shield layer 5 can be formed in continuous working processes by printing ad forming the respective ones in a series of processes according to a printing method such as a silk printing method, and thereafter hardening the respective printed layers.

The jumper wire 4 is formed through printing using a conductive paste containing a conductive metal such as silver, carbon or copper, and the shield layer 5 is formed through printing using a conductive metal resin paste such as copper.

The shield layer 5 is protected by being covered with an overcoat layer as needed.

In accordance with the present invention, malfunctioning of the circuit in a conductive pattern can be prevented by covering the jumper wire susceptible to unwanted exterior radiation noise with an electromagnetic wave shield layer.

What is claimed is

1. A printed-wiring board shielded from electromagnetic waves comprising: a conductive pattern formed on an insulating substrate and having connecting terminals, a jumper wire formed between a least two of the connecting terminals through a first insulating layer, a second insulating layer covering the jumper wire, and an electromagnetic wave shield layer disposed over the conducive pattern for shielding said conductive pattern including said jumper wire.

2. A printed wiring board shielded from electromagnetic waves comprising: an insulating substrate, a conductive pattern having connecting terminals and ground terminals and being formed on the insulating substrate, a first insulating layer disposed on the conductive pattern, a jumper wire formed between at least two of the connecting terminals and over the first insulating layer, a second insulating layer disposed on the jumper wire, and an electromagnetic wave shield layer disposed over the conductive pattern for shielding the conductive pattern and the jumper wire from electromagnetic waves.

3. A printed wiring board shielded form electromagnetic waves according to claim 2; wherein the first insulating layer covers the entire conductive pattern except for the connecting terminals and the ground terminals.

4. A printed wiring board shielded from electromagnetic waves according to claim 2; wherein the jumper wire comprises a conductive material.

5. A printed wiring board shielded from electromagnetic waves according to claim 4; wherein the conductive material is selected from the group consisting o silver, carbon and copper.

6. A printed wiring board shielded from electromagnetic waves according to claim 2; wherein the electromagnetic wave shield layer is composed of a conductive metal resin paste.

7. A printed wiring board shielded from electromagnetic waves according to claim 6; wherein the conductive metal resin paste contains copper.

8. A printed wiring board shielded from electromagnetic waves according to claim 2; including an overcoat layer disposed on the electromagnetic wave shield layer.

9. A printed wiring board shielded from electromagnetic waves according to clam 2; wherein the second insulating layer is also disposed on the first insulating layer.

10. A printed wiring board shielded from electromagnetic waves according to claim 2; wherein the jumper wire, the second insulating layer and the electromagnetic wave shield layer all comprise printed layers.

* * * * *